(12) United States Patent
Cardoso et al.

(10) Patent No.: US 6,585,908 B2
(45) Date of Patent: Jul. 1, 2003

(54) SHALLOW ANGLE INTERFERENCE PROCESS AND APPARATUS FOR DETERMINING REAL-TIME ETCHING RATE

(75) Inventors: Andre G. Cardoso, Braga (PT); Alan C. Janos, Darnestown, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/905,032

(22) Filed: Jul. 13, 2001

(65) Prior Publication Data

US 2003/0062337 A1 Apr. 3, 2003

(51) Int. Cl.$^7$ .................................................. B44C 1/22
(52) U.S. Cl. ...................... 216/60; 156/342.25; 216/67; 438/9
(58) Field of Search .............................. 438/9, 16, 725, 438/737; 216/60, 67; 156/345.25

(56) References Cited

U.S. PATENT DOCUMENTS

| 5,362,356 A | | 11/1994 | Schoenborn ................. 156/626 |
| 5,877,032 A | * | 3/1999 | Guinn et al. .................... 438/9 |
| 6,054,333 A | * | 4/2000 | Bensaoula ....................... 438/9 |
| 6,204,922 B1 | | 3/2001 | Chalmers ...................... 356/381 |

* cited by examiner

Primary Examiner—William A. Powell
(74) Attorney, Agent, or Firm—Cantor Colburn LLP

(57) ABSTRACT

A process and apparatus for determining a real-time etching rate during a plasma mediated etching process. Real-time etching rate determination includes monitoring an interference pattern generated by a direct light beam and a reflected light beam from a wafer surface. A viewing angle for recording the interference pattern is nearly parallel to the wafer plane and at a fixed focal point on the layer to be removed. The direct light beam and reflected light beams are generated in situ during plasma processing.

33 Claims, 6 Drawing Sheets

SHALLOW ANGLE INTERFERENCE PROCESS AND APPARATUS FOR DETERMINING REAL-TIME ETCHING RATE

TECHNICAL FIELD

The present invention relates to semiconductor processing and, more particularly, relates to an apparatus and method for measuring a real-time etching rate.

BACKGROUND

In the fabrication of integrated circuits, the semiconductor substrate or wafer is exposed to numerous process steps. One of the process steps includes etching the materials built up on the wafer to selectively remove certain portions to form the various features utilized in the fabrication of the integrated circuit. The portion removed is defined by a pattern generally formed using an organic photoresist mask. One type of etching process employs a dry chemistry that generally refers to the use of plasma having active species that react with the material to be etched, in order to volatilize and selectively remove the exposed portions. Another type of etching process (sometimes referred to as ashing) reacts with the photoresist to volatilize and strip the photoresist mask from the wafer.

A problem associated with plasma etching (ashing) processes is the difficulty in determining when the etch step has been completed. This difficulty occurs because plasma techniques are typically timed processes, based on predetermined etch rates. The predetermined etch rates are identified by performing a calibration step in which a relative etch rate is determined based on the amount of substrate removed during a known time interval. Since the exact conditions (i.e., pressure, gas flow, electric field, etc.) used during the calibration step may vary to some extent for the etch step during actual device fabrication, timed processes are inaccurate and only provide an estimate as to when the plasma etch process is completed. The time-based process does not provide a real-time etching rate.

As a consequence of the uncertainty in the time needed to etch a wafer, over-etching is used. This usually is defined as a fixed amount of time after which the etch is thought to be complete, in order to guarantee that the etching is complete over the entire wafer. Moreover, time-based processes typically require the use of dedicated equipment for thickness measurements, e.g., an ellipsometer. In order to determine a relative etching rate, before and after thickness measurement must be made thereby requiring operator intervention. More problematic is that the process introduces wafer-to-wafer variability since it is not a real time measurement of the etching rate.

In order to avoid the use of time-based processes for determining the endpoint of an etch step, diagnostic techniques have been developed which analyze the processes occurring in the reaction chamber. One such technique, called optical emission spectroscopy, monitors the intensity of the optical emission from both the plasma and the reactions on the wafer surface. The intensity of the optical emission is related to the concentration of molecular species generated. The completion of the etch process is determined when a change in the intensity of the optical emission is observed. A change in the intensity of the optical emission is observed when the concentration of particular molecular species being monitored is no longer present (or decreases dramatically) indicating that the layer responsible for reacting with the plasma to generate the particular monitored species has been removed. For example, an optical emission signal from hydroxyl species created during etching/ashing of a photoresist layer may be monitored to determine when the photoresist layer has been removed. Optical emission techniques require the reaction chamber to be equipped with an optical port for monitoring the optical emission.

One disadvantage of end-point systems is that the instantaneous ash rate is not known. Also, uncertainty in the end-point determination also requires over-etching.

Another disadvantage of present systems is that one cannot predict end-point. Some applications require the etch process to stop just short of end-point. This is particularly important for manufacturing of thin gate oxides. Unless one knows the instantaneous real-time etch rate, one cannot stop prior to completion with just an end-point system.

Optical interference is another known technique for etching rate measurement. A substrate or wafer with layers of thin material is illuminated with light of a known spectrum. Reflected light from the surface and material interfaces causes an interference pattern that is captured by an optical detector. The interference pattern behavior is determined by the differences in refractive index, thickness of the material being removed, wavelength and angles of incidence. As the thickness of the substrate changes, so does the interference pattern. This method requires the use of an external light source, usually a monochromatic light source such as a laser, dedicated equipment to collect, process and convert the optical interference pattern to a thickness measurement, and dedicated viewing ports in the reaction chamber for both incident and reflected/refracted light. However, the inclusion of such a system may not be a cost effective solution and as is most often the case, viewing ports cannot be arbitrarily located in the reaction chamber as this could impact on critical chamber geometries. For example, incident light and collection at an angle normal to the plane of the wafer requires the viewing port to be located in the same place as the source for the plasma/gas. Moreover, in process chambers using radiant heating to maintain the wafer at elevated process temperatures, the incident light for the optical interference diagnostic needs to be of considerable power so that reflected light is well above the strong background level emitted by the radiant heating source. However, use of such a laser can cause the substrate surface to locally overheat so that the local reaction rate deviates from the wafer average by a non-negligible amount. In this sense, the technique can no longer be considered non-perturbative.

Referring now to FIG. 1, there is shown a figure illustrating the general principles of optical interference for thin film coatings on reflective substrate materials. A semiconductor wafer 10 coated with a photoresist layer 12 having a thickness d and a refractive index n.

When an external light beam λ is projected over the photoresist surface, light is both reflected and refracted from the surface. The reflected light beam (1) and refracted light beams (2, 3, 4, . . . ) travel different distances depending on the refractive index of the material comprising the surface and the thickness of the photoresist layer. Assuming the thickness d to be constant throughout the length of relevant refractions, the difference in the distance traveled by consecutive refracted beams (2, 3, 4 . . . ) is L. This relationship can be described mathematically as shown in equations (1) and (2). For a monochromatic light source λ, the distance L corresponds to a phase shift Δϕ between consecutive beams in accordance with well known optical principles. It should be noted that what really matters is the difference in "optical" path length and not just geometric path length, since the light ray travels more slowly in materials of higher index of refraction. The optical path length depends on both the geometric path length and the index of refraction along that path.

$$L = 2d\sqrt{n^2-\sin^2\alpha} \qquad (1)$$

$$\Delta\phi = 2\pi(L/\lambda) \qquad (2)$$

If the beams 1 and 2 are in phase with one another at the detector, the beams produce a constructive interference pattern, i.e., $\phi=2k\pi$ (k integer). Conversely, if the beams are out of phase, the beams will provide a destructive interference pattern, i.e., $\Delta\phi=(2k+1)\pi$. That is, a minimum for one of the beams coincides with a maximum for the other beam, or vice versa, thereby canceling or subtracting each other out.

When the beams are projected onto a target, e.g., a photo detector or optical fiber, the phase shift $\Delta\phi$ will cause the reflecting light intensity to vary from zero (destructive interference) to a maximum (constructive interference). The light intensity will vary between zero and the maximum depending on the phase of the different beams and create an interference pattern. The interference pattern will provide evidence of constructive and destructive interference. Mathematically, constructive interference is defined by Equation (3). In contrast, destructive interference, taking into consideration the light that is out of phase, can be mathematically defined by Equation (4).

$$L = k\lambda, \; k \in N \qquad (3)$$

$$L = k\lambda + \lambda/2, \; k \in N \qquad (4)$$

For incident angles close to normal, the contributions from 3$^{rd}$ order and higher reflections are extremely small compared to the 1$^{st}$ and 2$^{nd}$ order reflections and for practical purposes, can be ignored since these higher order reflections do not affect the interference pattern. For example, for a phase shift of $\Delta\phi=(2k+1)\pi$, consecutive reflected beams 1 and 2, 2 and 3, 3 and 4, etc. will be out of phase whereas beams 1 and 3, 2 and 4, etc. will be in phase. However, since the intensity of consecutive reflections decreases exponentially, the dominant interference is that between beams 1 and 2, which as noted will be out of phase and as such, will produce a destructive interference pattern.

The determination of the phase shift is more complicated than just the delay imposed by the alternate paths of the reflected ray and refracted rays. At each interface, there is a reflected and a refracted ray. Depending on the incident angles at each interface, the relative indices of refraction, and the polarization of the electric field, an additional phase shift is imposed which can vary from 0 to $\pi$ radians. The light source is composed of rays of light with all polarizations. Specifically, there is both an s-wave, with the electric field vector perpendicular to the plane of incidence, and a p-wave, with the electric field vector parallel to the plane of incidence. The plane of incidence is defined by the plane containing both the incident and reflected (refracted) wave propagation vectors. Note that the electric field for the s-wave is sometimes referred to as $E_\perp$ and the electric field for the p-wave is sometimes referred to as $E\|$. The phase changes at each interface can be different for the s-wave and the p-wave. Hence, each has to be accounted for separately. At the detector, the net resulting phase change will be the result of phase changes due to both the optical path length differences and the phase changes at each interface along the path length, as applicable.

FIGS. 2 (a through d) shows the changes in phase for each of the components of the electric field for the cases of light traveling from a low index into a high index of refraction material (FIGS. 2a and 2b) and light traveling from a high index into a low index of refraction material (FIGS. 2c and 2d). (Note that these figures happen to be for the case of an index of refraction of 1.5 for the higher index material.) One can see a large variation in behavior, depending on relative indices, electric field polarization, and angle of incidence to each interface. The polarization angles $\theta_p$ and $\theta'_p$ for the two cases are defined as arctan ($n_{rel}$), where $n_{rel}=n_2/n_1$ is the relative index or ratio of indices between the two materials, where $n_1$ is the index for the material from which the light is incident. The critical angle $\theta_c$ is defined as arcsin($n_{rel}$).

FIGS. 3 (a,b,c) show the amplitude coefficients for the reflected and transmitted waves for both light traveling from a low index into a high index of refraction material (FIGS. 3a and 3b) and light traveling from a high index into a low index of refraction material (FIG. 3c).

As the photoresist thickness d decreases, e.g., during a plasma mediated stripping (etching or ashing) process, the interference pattern cycles between constructive interference patterns and destructive interference patterns. The distance between two consecutive minima or two consecutive maxima ($\Delta\phi=2\pi$), corresponds to the change in thickness $[\Delta d]_{one\; interference\; period}$, and can be mathematically described as shown in Equation (5).

$$[\Delta d]_{one\; interference\; period} = \lambda/(2\sqrt{n^2-\sin^2\alpha}) \qquad (5)$$

Thus, for incident light normal to the plane of the wafer ($\alpha=0$), the change in thickness $[\Delta d]_{one\; interference\; period}$ is given by Equation (6).

$$[\Delta d]_{one\; interference\; period} \approx \lambda/2n \text{ for } \alpha \approx 0 \qquad (6)$$

The sensitivity of thickness change to small angle variation is very low. For example, if the index of refraction for a photoresist is equal to 1.6 (n=1.6), a variation of 1° in the angle ($\alpha$) causes less than 0.006% error. The sensitivity of thickness change $[\Delta d]_{one\; interference\; period}$ to small angle variation is mathematically shown in Equation (7). Variations in the viewing angle can occur, for example, as a result of wafer misalignment or tilting.

$$Q_\alpha^{\Delta d} \equiv \frac{d(\Delta d)}{d\alpha} \cdot \frac{1}{\Delta d} = \frac{1}{2} \cdot \frac{\sin(2\alpha)}{n^2-\sin^2\alpha} \text{ for } \alpha \approx 0, \qquad (7)$$

$$Q_\alpha^{\Delta d} \equiv \frac{\alpha}{n^2}; \text{ for } \alpha \approx \frac{\pi}{2}, \; Q_\alpha^{\Delta d} = \frac{\pi/2-\alpha}{n^2-1}$$

where $\Delta d$ is assumed to stand for $[\Delta d]_{one\; interference\; period}$.

The rate of thickness change is calculated by measuring the time between two consecutive minima or maxima. Thus, for incident light normal to the plane of the wafer ($\alpha=0$), if time "T" is the interference period, the stripping rate "R" can be determined by Equation (8).

$$R = \left[\frac{[\Delta d]_{one\; interference\; period}}{T}\right] = \lambda/2nT \text{ for } \alpha \approx 0 \qquad (8)$$

As expected, the time resolution of the stripping rate R increases for short wavelengths since more interference periods will be observed per unit of time.

Optical interference normally requires the use of an external light source for providing the incident beams. Typically, the light sources include the use of laser diodes that emit monochromatic radiation at wavelengths greater than 600 nm. In radiantly heated reaction chambers, this particular wavelength range is not suitable since the radiant energy sources used to heat the wafers typically emit competing radiation. For example, tungsten lamps emit radiation from about 500 nm to about 2 μm thereby competing with the radiation emitted by the incident beam. The background noise contributed by the radiant energy sources affects the interference pattern caused by the incident beam on the substrate surface. In order to minimize the effect of this background noise, the intensity of the incident beam must be of a magnitude sufficient to overcome the noise level in the system. However, increasing the intensity of the beam can alter the temperature at the point of focus for the incident beam. The increase in temperature will affect the striping rate and as such, the real time plasma mediated stripping rate for the bulk photoresist will not be accurate.

The problem is exacerbated in low temperature stripping processes in which the stripping rate is strongly temperature dependent. Increasing the temperature to overcome the background radiation can cause the local stripping rate to be significantly higher than the wafer's average stripping rate across the wafer introducing an additional source of error in the observed rate.

It should be noted that the prior art processes fail to accurately depict the real-time etching rate. Rather, the prior art processes generally provide an average stripping rate. There accordingly remains a need in the art for an improved and robust process that is cost effective, accurately depicts a real time etching rate and minimizes the equipment dedicated to performing the rate measurements.

SUMMARY OF THE INVENTION

The present invention is directed to a process for determining a real-time stripping rate of a photoresist coating from a wafer. The process includes placing a wafer having a photoresist coating thereon into a plasma reaction chamber, wherein the reaction chamber includes a port. An optical detector is coupled to the port, wherein the optical detector includes receiving optics at a viewing angle nearly parallel to a plane of the wafer surface and fixedly focused at a focal point on a surface of the photoresist. A plasma comprising reactive species is generated and the photoresist is exposed to the reactive species. Interference signals are monitored and received by the optical detector, wherein the interference signals are produced from a direct light beam and light beams reflecting and refracting off the wafer. The direct, reflected and refracted light beams are generated within the chamber and are monitored at the same wavelength. An interference pattern is extracted from the interference signals and a real time etching rate R is calculated from the interference signals according to the relationship:

$$R=\lambda/(2T\sqrt{n^2-1})$$

wherein λ is the wavelength of the light beams generated in situ by the plasma or by a reaction between the photoresist and the reactive species or by an internal lamp used for heating the wafer; T is the time period interval between two consecutive minima in the interference pattern; and n is the refractive index of the photoresist measured at λ.

An apparatus for measuring the real time plasma etching rate includes a plasma reaction chamber containing a port. An in situ light source within the reaction chamber illuminates a predetermined surface of the substrate, wherein the light source produces a direct light beam and a plurality of reflected and refracted light beams at the same wavelength. An optical detector is coupled to the port and includes receiving optics focused at the predetermined surface at an angle nearly parallel to the plane for receiving interference light signals produced by the direct, reflected and refracted light beams off the wafer. The apparatus includes computing means in communication with the receiving optics for computing the real time etching rate from the interference signals generated by the direct, reflected and refracted light beams. The computing means calculates the real time etching rate based on an interference pattern generated from the interference signals, the refractive index of the material to be removed and the selected wavelength of the direct, reflected and refracted light beams.

Other embodiments of the invention are contemplated to provide particular features and structural variants of the basic elements. The specific embodiments referred to as well as possible variations and the various features and advantages of the invention will become better understood when considered in connection with the detailed description and drawings that follow.

DETAILED DESCRIPTION OF THE PREFERRED EMBODIMENTS

Figure 1:
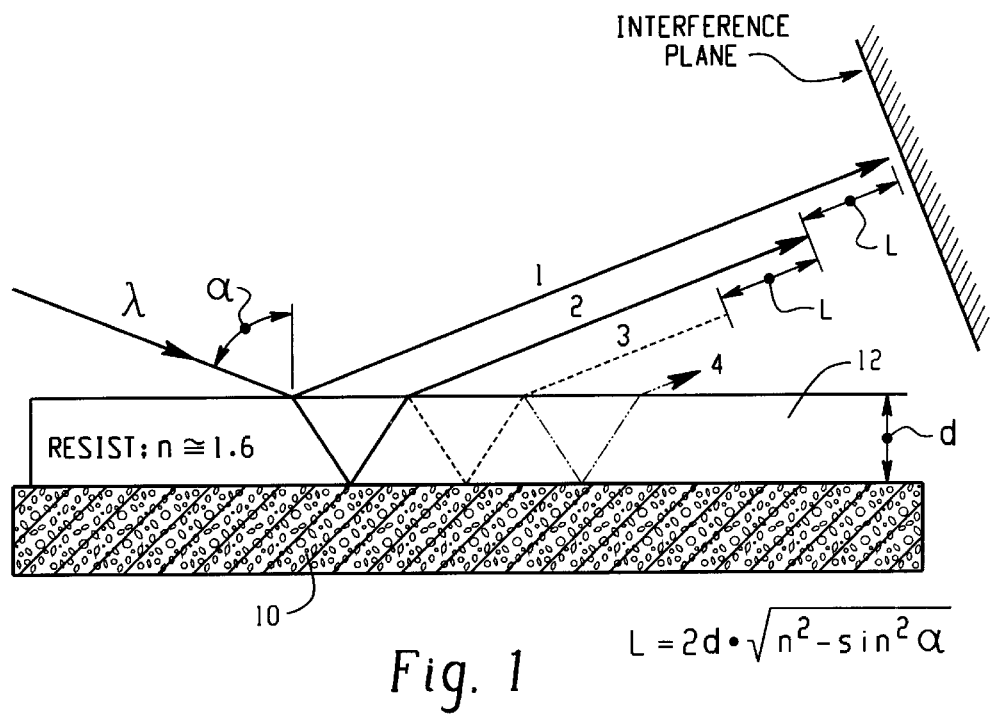
FIG. 1 is a schematic representation of interference from multiple reflections/refractions within a thin transmitting film on a reflective substrate, and is representative of the prior art.

A process and apparatus for real-time etching rate measurement includes measuring a shallow-angle interference pattern during etching or ashing (stripping). The light source used for the shallow angle interference measurement is the light emitted during the etching process. The emitted light is generated in situ either by the plasma, by light emitting species generated during reaction of the plasma with the substrate, or by the radiant heating lamp system. Advantageously, the process and apparatus can be adapted for use with existing viewing ports, optics and endpoint detection equipment normally found in the etching equipment. Moreover, the process and apparatus can be configured to operate simultaneously with an endpoint detection process and apparatus to simultaneously provide real time etching rate measurements and end point detection in a very cost effective manner.

An example of such apparatus is given in U.S. patent application Ser. No. 09/449,338, incorporated herein by reference in its entirety, which describes hardware designed for advanced end-point detection and shallow-angle measurements. This hardware system is ideal for the application of the present invention.

Note that while the analysis up to now has considered one incident beam direction at a time, the receiving optics actually accepts rays of various angles within a cone defined by the size of the receiving optics. Hence, there is a cone of angles around the nominal angle defining a group of incident angles.

The process and apparatus apply well-known optical interference principles to measure, in situ, the real time etching rate. In particular, the process and apparatus employ a shallow angle optical interference technique wherein the observation angle is nearly parallel to the wafer. That is, the interference plane for the receiving optics will be close to 90 degrees with respect to the normal to the wafer. The focal point of the receiving optics for the apparatus is set at the wafer surface such that light contributing to the interference pattern captured by the receiving optics has a localized origin. The focused collection point may generally be considered to emulate a laser incidence spot in the traditional interference scheme described in the background section. Since the viewing angle for the optical detector is almost parallel to the wafer plane, the effects from background radiation caused by radiant heating sources are minimal. Shallow angle interference also allows use of the Advanced End-Point System hardware (as described in U.S. patent application Ser. No. 09/449,338), which reduces radiant heating lamp light low enough so as to avoid stray light problems within the detection system (e.g., spectrometer). Stray light can corrupt the spectral separation of wavelengths and high light levels can saturate the detector. (Stray light is light of one wavelength, which, due to scattering off numerous optical surfaces, is not routed in the detector instrument as intended. This becomes significant when the intensity is very high relative to signal levels one is looking at.) Thus, the process and apparatus can be used in those etching systems including radiant heating sources.

Figure 4:
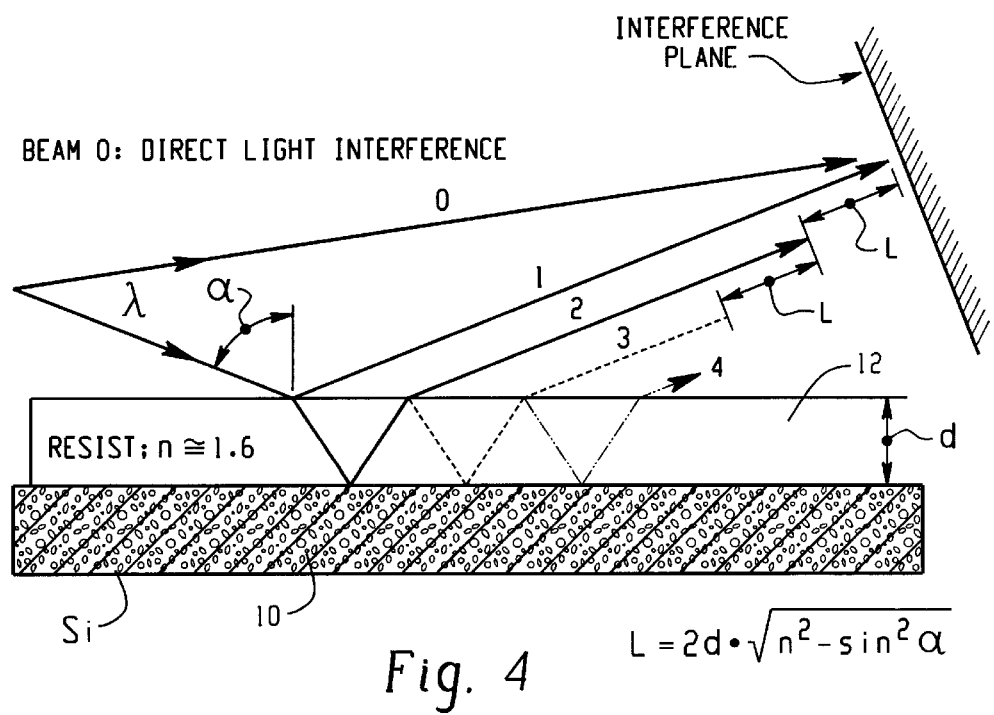
FIG. 4 is a schematic representation of interference including a direct light source and multiple reflections/refractions within a thin transparent film on a reflective substrate.
Figure 2A:
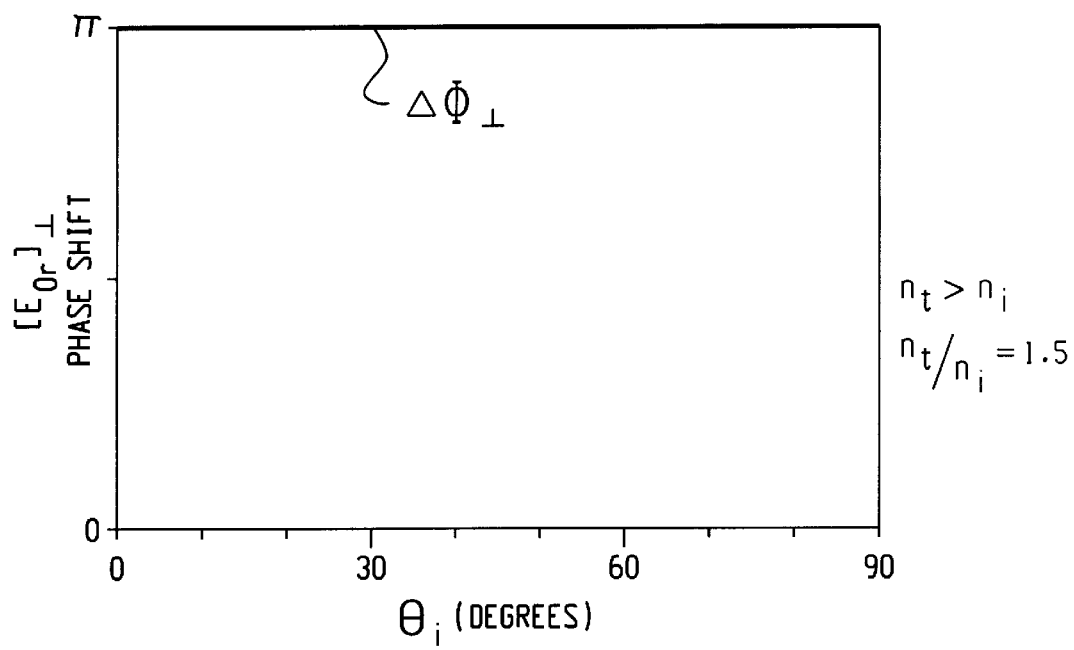
FIGS. 2 (a–d) shows the phase shift for s-waves and p-waves for the two conditions of $n_{rel}=n_1/n_2$: $n_{rel}>1$ and $n_{rel}<1$.
Figure 2B:
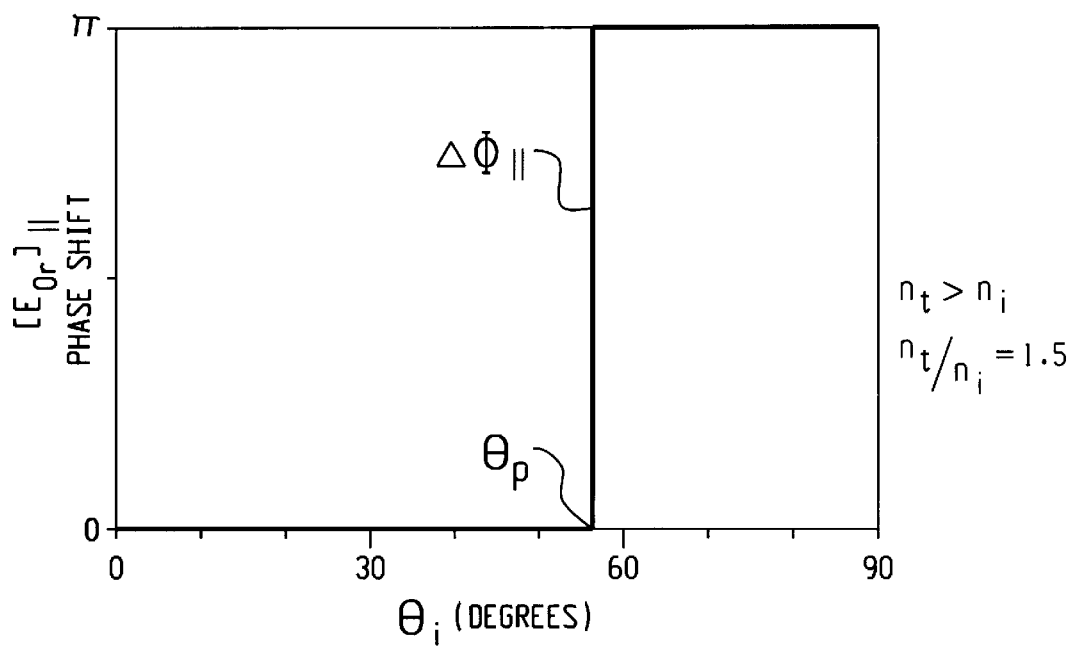
Figure 2C:
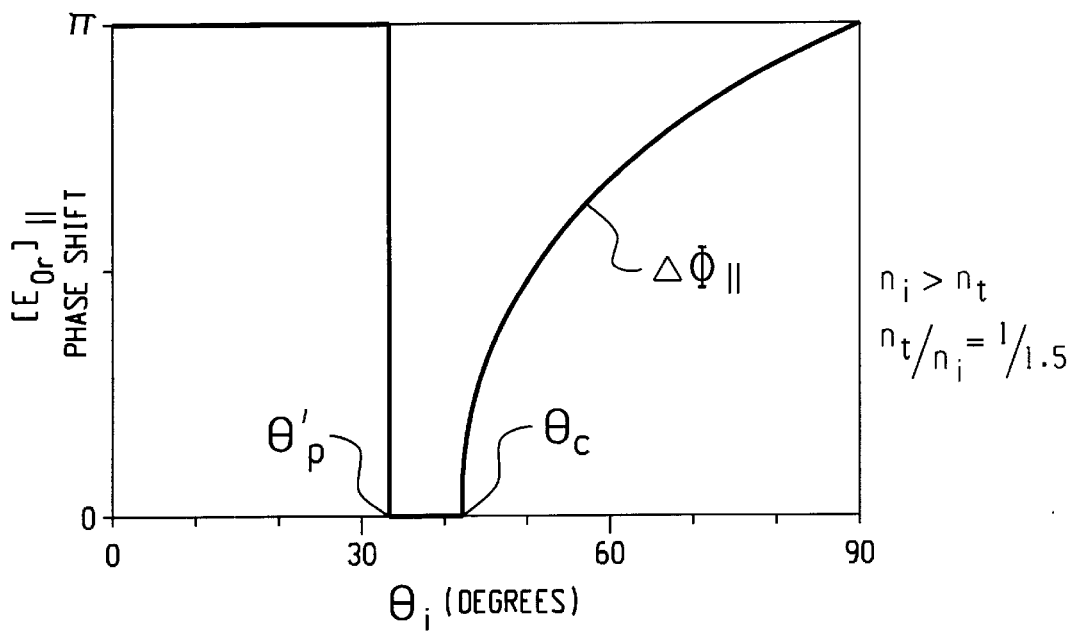
Figure 2D:
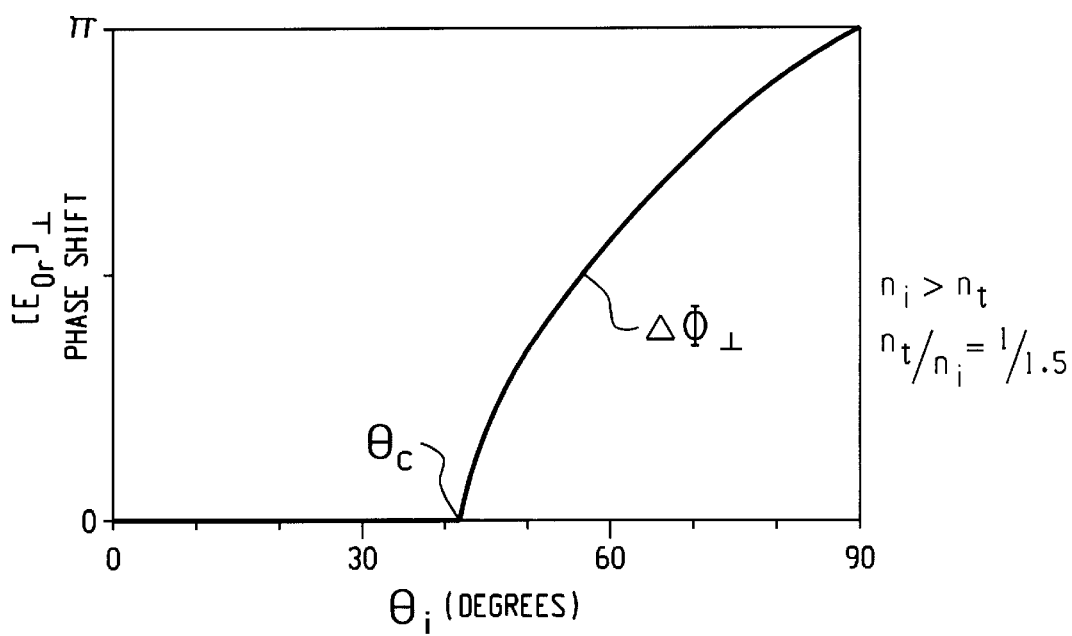
Figure 3A:
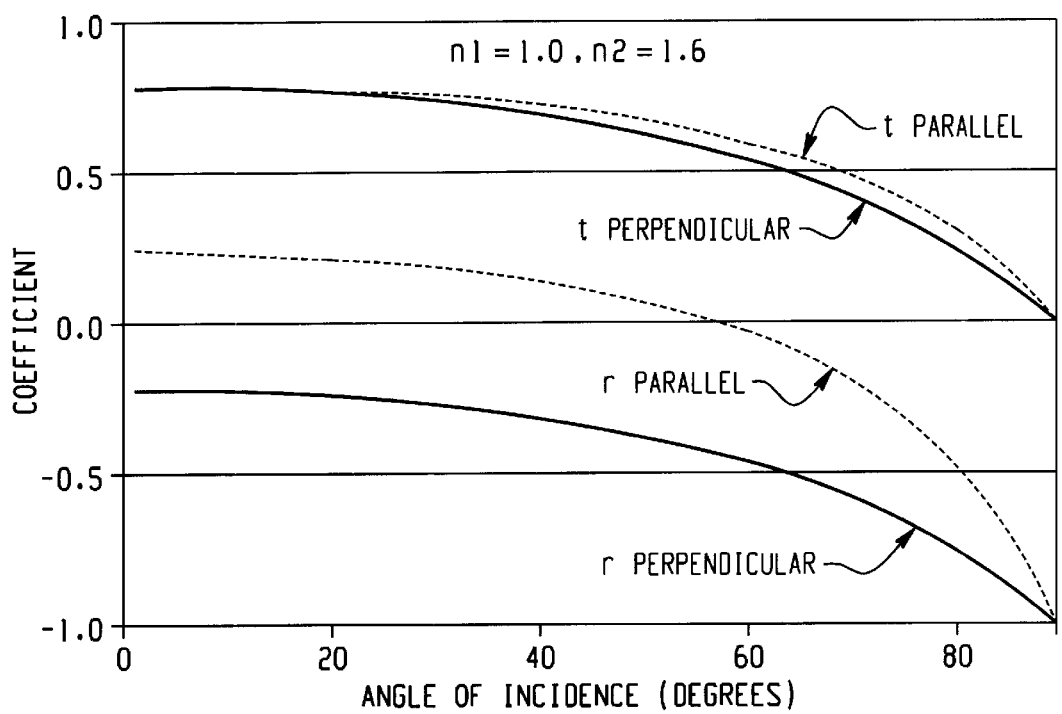
FIGS. 3 (a–c) shows the amplitude coefficients for reflection and transmission for both s-waves and p-waves for the two conditions of $n_{rel}=n_1/n_2$: $n_{rel}>1$ and $n_{rel}<1$ for both interfaces.
Figure 3B:
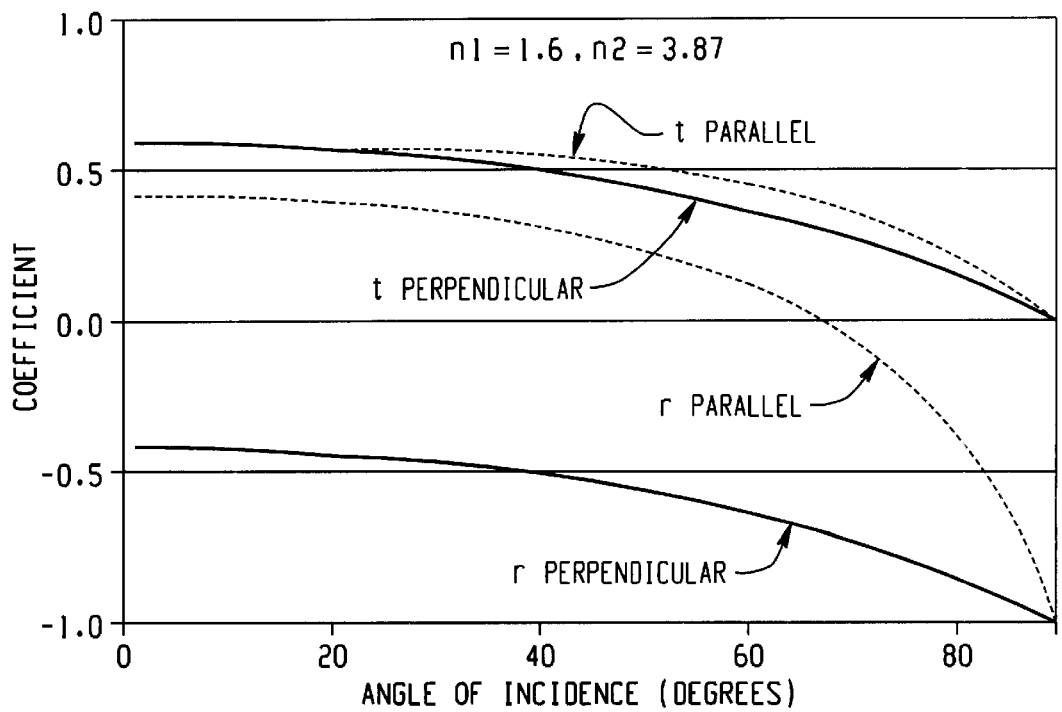
Figure 3C:
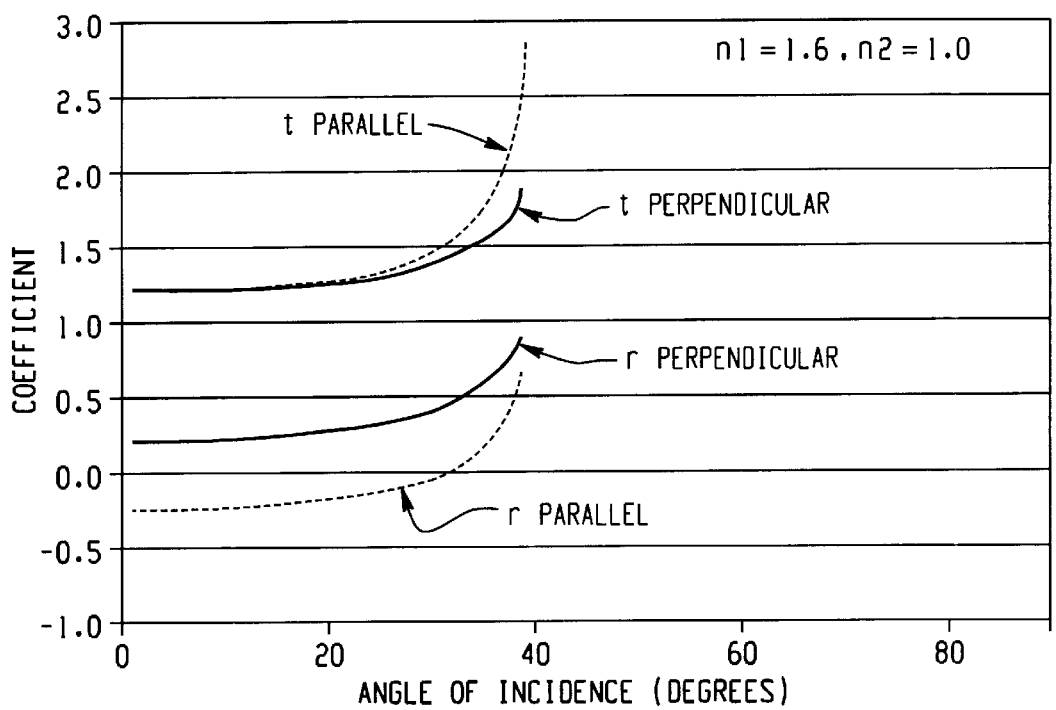
Figure 5:
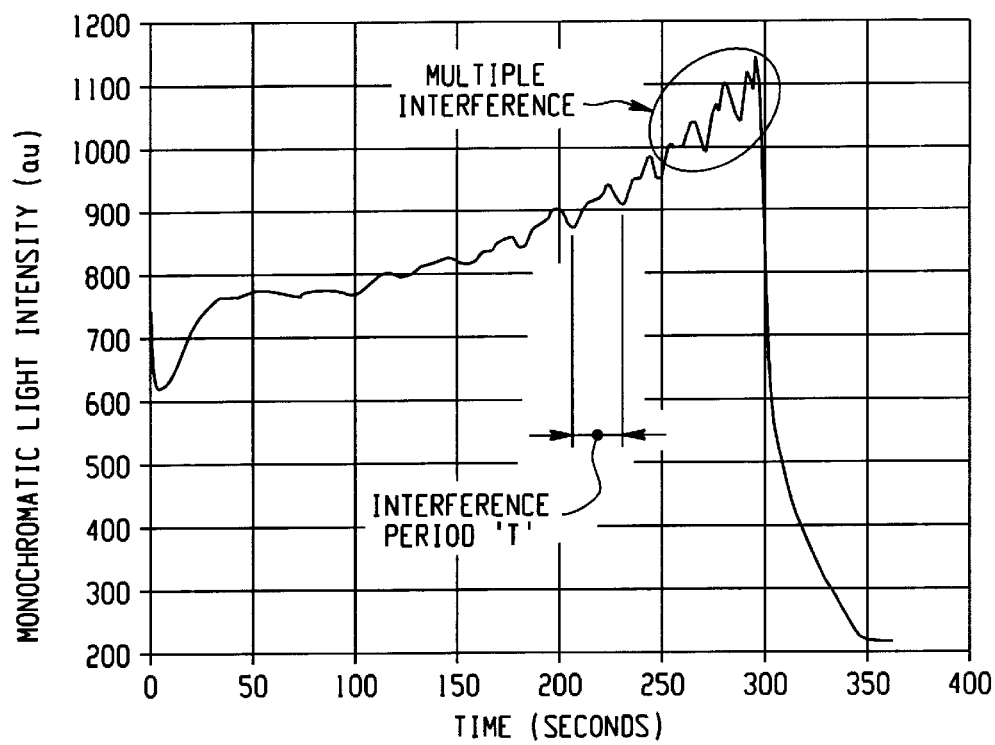
FIG. 5 is a graph showing monochromatic intensity as a function of time and interference periods.
Figure 7:
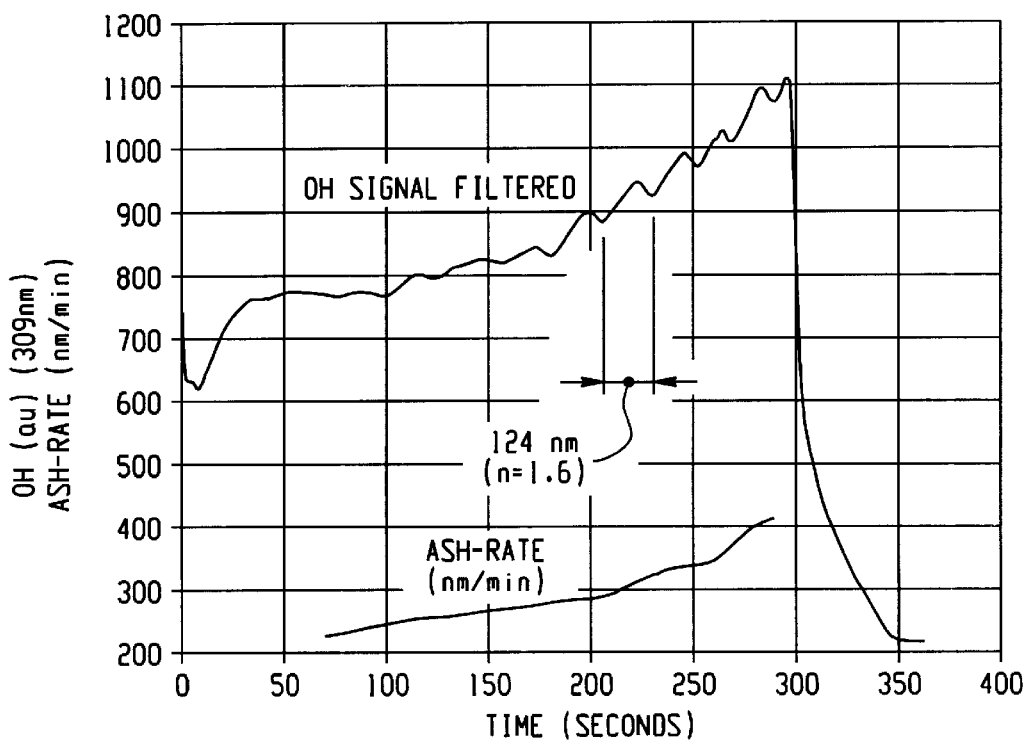
FIG. 7 shows a typical output trace of a real time etching rate and a simultaneous endpoint detector trace showing the intensity of emitted radiation at 309 nm as a function of time.

As shown in FIG. 4, the use of shallow angle interference allows the use of direct light to contribute to the interference pattern, i.e., light beam 0. Should the light collection area at the wafer surface be large, the sum of light intensity from every elementary point in that area would average and cancel the interference pattern. Hence, the receiving optics focus on a small spot on wafer. Note that multiple spots can be monitored simultaneously with multiple detector channels. In such a scheme, the incident light originates either from (1) the reaction of the plasma with the photoresist a on the surface or immediately above the wafer surface, or (2) the plasma itself, or (3) from the internal radiant heating system lamps. The interference pattern becomes more pronounced as the resist film thins (as shown in FIG. 5), and higher order refractions also become evident. (While not wanting to be bound by theory, this is probably due to reduced absorption of light by the thin films.)

Referring to the discussions above, the nominal values of the various indices of refraction for the present invention are shown in Table I.

TABLE I

| Material | Index of Refraction |
| --- | --- |
| Process chamber atmosphere | 1.0 |
| Resist | 1.6 |
| Silicon wafer | 3.87 |

The corresponding special angles (see figures) for the chamber atmosphere-to-resist interface, are shown in Table II.

TABLE II

| Special Angle | Value (degrees) |
| --- | --- |
| $\theta_p$ | 57.99 |
| $\theta'_p$ | 32.01 |
| $\theta_c$ | 38.68 |

The corresponding special angles, for the resist-Si wafer interface, are shown in Table III.

TABLE III

| Special Angle | Value (degrees) |
| --- | --- |
| $\theta_p$ | 67.54 |

Note that while in the present treatment the substrate below the resist was assumed to be silicon, other substrate materials could exist there and the resultant operation of this invention would be similar.

Note that any more shallow of an incident angle onto the wafer than approximately 88.5° would result in very little light getting into the resist and, for the small amount of light that gets inside, total internal reflection of the light inside the resist would occur for a non-absorptive resist. If this were to occur, no interference pattern would result. In actuality, the resist has a small amount of absorption.

From these figures and tables, one sees that all the phase shifts at interfaces are either 0 (or nearly zero) or $\pi$ (or nearly $\pi$) radians, leading to symmetric signal waveforms. (However, see below for direct light contribution.)

The net phase shifts due to interfaces only are therefore, for the present invention, shown in Table IV.

TABLE IV

| | s-wave | p-wave |
| --- | --- | --- |
| Reflected Ray (1) | $\pi$ | $\pi$ |
| 1$^{st}$ Refracted Ray (2) | $\pi$ | 0 |
| 2$^{nd}$ Refracted Ray | 2$\pi$ | 0 |

Hence, for the present invention, the phases are either in-phase or out-of-phase. For the net signal at the detector, all of the above phase shifts and reflection/refraction coefficients have to be taken into account for the various rays in order to be able to predict the resulting waveform of the signal over time. The non-zero absorption of light as it passes through the different materials also has to be taken into account and will modify the coefficients as displayed in the figures above. This behavior can result in quite complicated looking net waveforms at the detector. Each wave (s- and p-wave) has its own phase shifts in addition to the fundamental and secondary harmonics due to the change in film thickness. The bottom line, however, is that the net waveform can be decomposed into both a fundamental and secondary harmonic. Of course, the waveform can be simplified by filtering one of the two polarizations of electric field.

The use of a direct light component (beam 0) changes the signal behavior for a fixed geometry and location of source of light. At the detector, there is a difference in the phase $\delta$ between the direct component and all others simply due to the difference in the geometric path lengths. While this phase difference is the same constant between the direct light and all other beams, its effect on the other beams differs for certain beams since it is added to the other phase shifts and the rate of change of the phase due to changes in the resist film thickness for the second refracted beam is twice that for the first refracted beam. The net effect on the signal at the detector is a shift in phase relative to the no-direct light case and also usually a change in waveform. In both cases, the frequency components due to the film thickness variation are the same; that is, there are components of both the primary frequency and a second harmonic frequency, although to different extents. The interference period is still governed by the differences in phase shift between the reflected and refracted beams.

The additional phase shift introduced by the difference in geometric path length between the direct light and all the other beams is estimated to be roughly 0.2–0.8 radians, from modeling of the detected signal. This corresponds to, for the incident angle of 88.5°, of a difference in distances of 10–40 nm. This, in turn, corresponds to a location of the source of light 10–30 microns away from the reflection point. Thus, the source of light is very close to the wafer (especially considering the shallow angle of incidence), for the specific example given in the figures herein, using light from the reaction on the wafer surface. Hence, this additional phase shift can be used to help determine the origin of the source of light being used for the interference analysis.

In fact, for this shallow angle operation, it would be difficult not to simultaneously detect direct light.

FIG. 5 shows a second, superimposed interference, whose oscillation becomes visible about halfway though the process at about 125 seconds and increases in intensity as the process progresses. The figure suggests that this additional oscillation has twice the frequency of the fundamental interference (similar to a second harmonic) and that its minima are almost coincident to both minima and maxima of the fundamental interference. The maxima and minima do not coincide exactly due to the phase shift $\delta$. The double frequency oscillation results from the interference between beams 1 and 3 since the path length is 2 L for a given film thickness. That is, the thickness change produces twice the phase shift as that between beams 1 and 2. Once the oscillation becomes visible, it is preferable to measure the interference period between two minima of the fundamental primary frequency to avoid measurement errors for the case presented here. Measuring the interference period between two maxima is more prone to measurement error due to the presence of secondary maxima located proximate to the primary maxima. Alternatively, one can track the secondary harmonic and get twice the time resolution.

Figure 6:
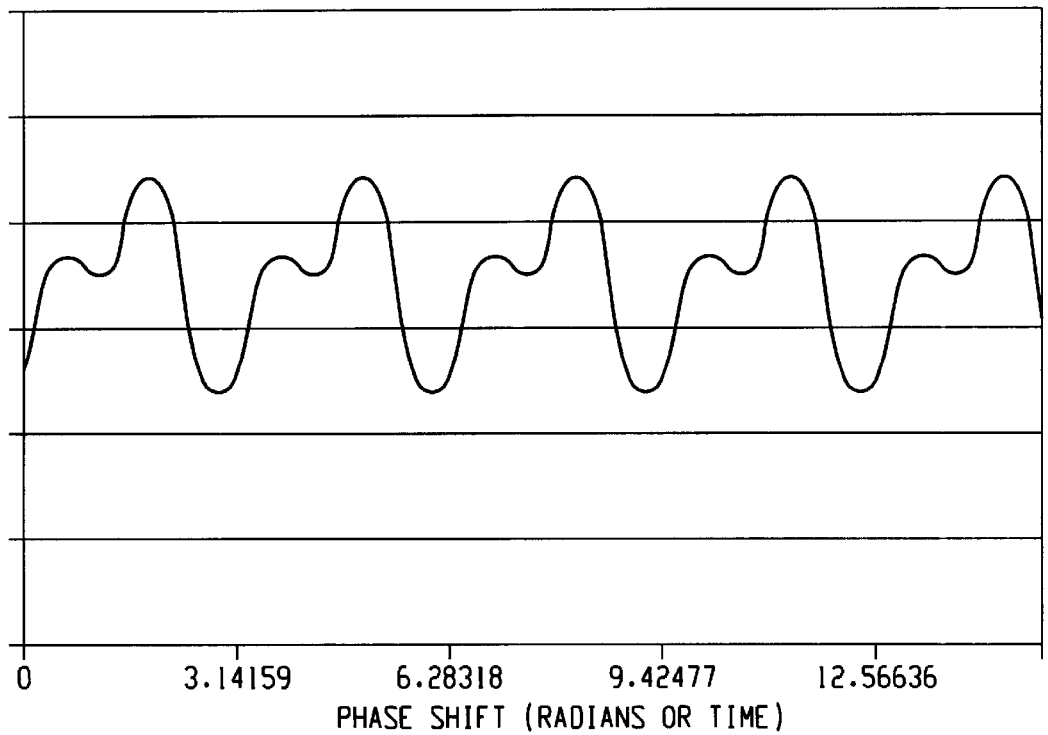
FIG. 6 is a graph showing modeled interference patterns generated with a direct light source.

FIG. 6 illustrates a modeled interference pattern with direct light interference. In the interference pattern, beam 3 (see FIGS. 1 and 2) was taken into account. For the model illustrating an interference pattern for direct light, it was assumed that the path difference between beams 0 and 1 would introduce a phase shift of 0.75 radians.

The thickness variation corresponding to the distance between two minima $[\Delta d]_{one\ interference\ period}$ is given by equation (9) since the $\sin^2\alpha$ approximates 1 for shallow viewing angles ($\alpha \approx 90°$). If "T" is used to define the interference period, then the stripping rate R may be given by equation (10). As in the case of normal incidence, the sensitivity of thickness variation $[\Delta d]_{one\ interference\ period}$ to small angle variation is advantageously very small. For example, for a deviation of 1.5° ($\alpha=88.5°$), an error of less than 0.04% will be introduced. Likewise, the error contribution due to wavelength $\lambda$ variation is also very small since the particular wavelength for any given process can be easily and fully characterized by conventional methods.

$$[\Delta d]_{one\ interference\ period} = \lambda/(2\sqrt{n^2-1})\ for\ \alpha \approx 90° \qquad (9)$$

$$R = \lambda/(2\ T\sqrt{n^2-1})\ for\ \alpha \approx 90° \qquad (10)$$

Sources of error in calculating stripping rate R are the refractive index n and determination of the time variable between successive minima T. The refractive index of the photoresist or material to be removed from the wafer requires careful determination at the wavelength of the beams monitored in the process. Those skilled in the art understand that refractive index is not constant throughout a given wavelength range and as such, requires determination at the wavelength of light used in the process. For example, a 4% error in the ash rate would result if the refractive index were determined to be 1.64 as opposed to 1.60 for a wavelength at 309 nm.

In cases of short interference periods (high stripping rate), it is preferred to increase the acquisition frequency in order to maintain a good accuracy level. If a high enough acquisition rate cannot be set, the interference minima most likely will fall between two data acquisition points (fence effect) and the time accuracy of the minima may be insufficient. In such a scenario, interpolation techniques may be used to estimate the time location of the minima between two data points. For example, if the data acquisition interval is set at 0.1 seconds as opposed to 0.01 seconds, the error introduced in ash rate is only 0.5%.

The advantages of the rate determination process using shallow angle interference principles with the direct light source are as follows:

1. Eliminates the need for an external, monochromatic light source that in turn eliminates the need for additional viewing ports in the reaction chamber. Preferably, the process employs a reaction chamber having viewing ports normally present for use with end point detection optical equipment. Preferably, the viewing angle for the port is at an angle nearly parallel to the surface plane of the wafer.

2. The light source has a known and stable spectrum. The spectrum is unique for each etching process depending on the gas chemistries and for most cases is well characterized. For example, for an oxygen-based plasma, the reaction with phenolic-based photoresist produces intense emissions corresponding to an —OH emission signal at 309 nm and a —CH emission signal at 431 nm. Alternatively, the process can utilize a wavelength selected from the spectrum generated by the plasma, prior to any reaction or exposure to the substrate. Alternatively, the process can utilize a wavelength selected from the spectrum of the lamp used to heat the wafer.

3. The available wavelengths generated by the reaction byproducts can be typically found in the UV region. The ultraviolet region is hereinafter defined as encompassing the region of the electromagnetic spectrum between visible light and X-Rays. Preferably, the wavelengths generated by the reaction byproducts are from about 200 nm to about 400 nm. Using shorter wavelengths offers significantly higher resolution relative to conventional laser light processes that typically employ wavelengths greater than 600 nm. The use of shorter wavelengths provides greater interference cycles per unit of time. However, longer wavelengths can be used; especially for thicker films, slower ash rates, or for films which are not transmissive in the ultraviolet region.

4. The process for determining a real-time etching rate can be combined with endpoint detection since the same equipment sets can be used thereby minimizing costs and equipment space.

The following examples fall within the scope of, and serve to exemplify, the more generally described methods set forth above. The examples are presented for illustrative purposes only, and are not intended to limit the scope of the invention.

EXAMPLE 1

In this example, the stripping rate is determined using shallow angle interference. A wafer having photoresist thereon was placed in a reaction chamber of a Gemini ES Plasma Asher. The wafer was exposed to an oxygen-based plasma. The angle of the interference plane for the receiving optics with respect to the wafer plane was about 89 degrees. The data was collected using the optics and viewing ports configured for end point detection. The emission signal corresponding to the OH signal at 309 nm was monitored and the results are shown in FIG. 5. The signal received by the optics was filtered to reduce the effect of secondary interference. At 309 nm, the refractive index of the photoresist was determined to be 1.6 using conventional ellipsometry techniques (n=1.6). The amount of photoresist removed during the time between two minima was determined as follows:

$$[\Delta d]_{one\ interference\ period} \approx 309\ nm/(2\sqrt{1.6^2-1}) \approx 124\ nm$$

Taking into account the successive intervals between minima, the stripping rate is determined as shown in FIG. 5. The stripping rate increases from about 225 nm/min to a maximum of about 400 nm/min. The stripping rate provides a real-time measurement. Although the intensity of OH signal was observed as increasing during the stripping process, its variability did not affect the periodicity of the interference pattern. As previously discussed, the intensity change of the OH signal is qualitative and is not proportional to the stripping rate. The data obtained was used to determine the real-time stripping rate and the process end point (t≈360 seconds)

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A process for determining a real-time stripping rate of a photoresist coating from a wafer, the process comprising:

placing a wafer having a photoresist coating thereon into a plasma reaction chamber, wherein the reaction chamber includes a port;

coupling an optical detector to the port, wherein the optical detector comprises receiving optics at a viewing angle nearly parallel to a plane of the wafer surface and, wherein the receiving optics are fixedly focused at a focal point on a surface of the photoresist;

generating a plasma comprising reactive species and exposing the photoresist to the reactive species;

monitoring interference signals received by the optical detector, wherein the interference signals are produced from a direct light beam and a light beam reflecting and refracting off the wafer, wherein the direct, reflected and refracted light beams are generated within the chamber and are at the same wavelength;

extracting an interference pattern from the interference signals; and calculating a real time etching rate R from the interference signals according to the relationship:

$$R=\lambda/(2T\sqrt{n^2-1})$$

wherein $\lambda$ is the wavelength of the light beams generated in situ by the plasma or by a reaction between the photoresist and the reactive species or by an internal lamp used for heating the wafer; T is the time period interval between two consecutive minima in the interference pattern; and n is the refractive index of the photoresist measured at $\lambda$.

2. The process according to claim 1, wherein $\lambda$ is selected from species emitting a wavelength in the ultraviolet region.

3. The process according to claim 1, wherein $\lambda$ is the wavelength for selected species emitted within the plasma, wherein the wavelength is free from species emitted by the reaction of the plasma with the photoresist.

4. The process according to claim 1, wherein $\lambda$ is the wavelength for selected species emitted by the reaction of the plasma with the photoresist.

5. The process according to claim 1, wherein $\lambda$ is the wavelength emitted by the internal lamp used for heating the wafer.

6. The process according to claim 1, wherein the photoresist comprises phenolic moieties and wherein $\lambda$ is selected from the group of wavelengths consisting of 309 nm and 431 nm.

7. The process according to claim 1, wherein T is the time period interval between two consecutive maxima in the interference pattern.

8. The process according to claim 1, further comprising simultaneously detecting an endpoint, wherein measuring the endpoint comprises monitoring a light emission intensity signal of selected reactants or a reaction product, wherein the endpoint is determined when the light emission intensity of the selected reaction product is at about zero.

9. The process according to claim 1, further comprising simultaneously detecting an endpoint, wherein measuring the endpoint comprises monitoring light emission intensity signals of selected reactants or a reaction product, wherein the endpoint is determined when an appropriate ratio of signals or combinations of signals and derivatives of the signals, with proper filtering undergo a significant change.

10. The process according to claim 8, wherein the endpoint light emission intensity signal consists of the same wavelength as the intensity signals produced by the direct light beam and the reflected light beams.

11. The process according to claim 1, wherein a variability in intensity of the monitored signal does not affect the periodicity of the interference pattern.

12. The process according to claim 1 wherein an interpolation process is used to estimate a time location of the minima between two data points.

13. The process according to claim 1, further simultaneously detecting an endpoint with the optical detector used for measuring the real-time etching rate, wherein measuring the endpoint comprises monitoring a light emission intensity signal of a selected reaction product, wherein the endpoint is determined when the light emission intensity of the selected reaction product is at about zero.

14. A process for determining a real-time etching rate, the process comprising:

exposing a planar wafer having a reflective surface and a film coating thereon to a plasma;

monitoring a focal point at a surface of the film coating and at a viewing angle nearly parallel to the wafer plane, wherein the step of monitoring comprises recording interference signals produced by a direct light beam, a reflected light beam and a refracted light beam of the same wavelength; and calculating a real time etching rate R from the interference signals according to the relationship:

$$R = \lambda/(2T\sqrt{n^2-1})$$

wherein $\lambda$ is the wavelength of the light beams; T is the time period interval between two consecutive minima in an interference pattern produced by the interference signals and n is the refractive index of the film coating measured at $\lambda$.

15. The process according to claim 14, further comprising generating the direct, reflected and refracted light beams from a light emitting species generated in the plasma.

16. The process according to claim 15, wherein the light emitting species is a reaction product generated during the reaction of the film coating with the plasma.

17. The process according to claim 15, wherein the light emitting species is emitted by an internal lamp source used to heat the wafer.

18. The process according to claim 14, wherein the direct, reflected and refracted light beams are selected from light emitting species having a wavelength in an ultraviolet region.

19. The process according to claim 14, wherein the film coating comprises a photoresist.

20. An apparatus for measuring a real time plasma etching rate, the apparatus comprising:

a plasma reaction chamber containing a port;

an in situ light source within the reaction chamber for illuminating a surface of the substrate, wherein the light source produces a direct light beam and a plurality of reflected and refracted light beams at the same wavelength;

an optical detector coupled to the port and including receiving optics focused at the surface at an angle nearly parallel to the plane for receiving interference light signals produced by the direct, reflected and refracted light beams off the wafer; and computing means in communication with the receiving optics for computing a real time etching rate from the interference signals generated by the direct, reflected and refracted light beams, wherein the computing means calculates the real time etching rate based on an interference pattern generated from the interference signals, the refractive index of the material to be removed and a wavelength of the direct, reflected and refracted light beams.

21. The apparatus of claim 20 further comprising a radiant heat source in the reaction chamber.

22. The apparatus of claim 20 further comprising a second computer means for computing an etching endpoint, the second computer means comprising calculating the endpoint from a change in an intensity of the interference signals generated during the real time etching rate calculations.

23. The apparatus of claim 20, wherein the light source is a wavelength selected from light emitted by species generated by the plasma.

24. The apparatus of claim 20, wherein the light source is a wavelength selected from light emitted by species generated by a reaction between the plasma and the substrate.

25. The apparatus of claim 20, wherein the viewing angle of the optical detector is non-perpendicular to the plane of the wafer surface.

26. The apparatus of claim 20, wherein the light source is a wavelength selected from light emitting species emitted by a radiant heat source.

27. An apparatus for measuring a real time plasma etching rate, the apparatus comprising:

a plasma reaction chamber containing a port;

a light source, wherein the light source comprises light emitted during an etching process and wherein the light source comprises a direct light beam and a plurality of reflected and refracted light beams at the same wavelength;

receiving optics coupled to the port including an observation angle nearly parallel to a wafer plane and a focal point, wherein the focal point is set at a point on the wafer plane such that light contributing to an interference signals produced by the direct light beam and the plurality of reflected and refracted light beams, and received by the optics has a localized origin; and computing means in communication with the receiving optics for computing a real time etching rate from the interference signals generated by the direct, reflected and refracted light beams, wherein the computing means calculates the real time etching rate based on an interference pattern generated from the interference signals, the refractive index of the material to be removed and a wavelength of the direct, reflected and refracted light beams.

28. The apparatus of claim 27, wherein the light emitted during an etching process is generated by a plasma.

29. The apparatus of claim 27, wherein the light emitted during an etching process is a light emitting species generated during reaction of the plasma with the substrate.

30. The apparatus of claim 27, wherein the light emitted during an etching process is generated by a radiant heating lamp system.

31. The apparatus of claim 27, further comprising a plurality of multiple detectors, wherein each one the plurality of multiple detectors includes a focal point set at a different point on the wafer plane such that light contributing to an interference signals produced by the direct light beam and the plurality of reflected and refracted light beams, and received by the optics has a localized origin.

32. The apparatus of claim 27, wherein an angle of incidence for the direct light is less than about 88.5 degrees.

33. A process for determining a real-time etching rate, the process comprising:

exposing a planar wafer having a reflective surface and a film coating thereon to a plasma;

monitoring a surface of the film coating and at a viewing angle nearly parallel the wafer plane;

recording interference signals produced by a direct light beam, a reflected light beam; and a refracted light beam of the same wavelength; and calculating a real time etching rate from the interference signals.

* * * * *